(12) United States Patent
Lai

(10) Patent No.: US 6,381,813 B1
(45) Date of Patent: May 7, 2002

(54) DEVICE FOR RETAINING COOLING PIECE

(76) Inventor: Yaw-Huey Lai, No. 20-3, Lane 65, Lien Cheng Rd., Chung Hu City, Taipei Hsien (TW)

( * ) Notice: Subject to any disclaimer, the term of this patent is extended or adjusted under 35 U.S.C. 154(b) by 7 days.

(21) Appl. No.: 09/588,597

(22) Filed: Jun. 7, 2000

(30) Foreign Application Priority Data

May 19, 2000 (TW) .......................................... 089208594

(51) Int. Cl.$^7$ ................................................. H05K 7/20
(52) U.S. Cl. ............................ 24/456; 24/459; 361/704
(58) Field of Search .......................... 24/459, 456, 625; 361/704, 707, 709, 710, 717–719; 257/718, 719, 726, 727; 165/80.2, 80.3; 29/243.56, 229; 411/522, 523

(56) References Cited

U.S. PATENT DOCUMENTS 585,423 A * 6/1897 Bogle
1,256,426 A * 2/1918 Baltzley
1,557,370 A * 10/1925 Lane
5,208,731 A * 5/1993 Blomquist
5,241,453 A * 8/1993 Bright et al.
5,979,025 A * 11/1999 Horng
6,111,752 A * 8/2000 Huang et al.
6,219,238 B1 * 4/2001 Andros et al.
6,256,846 B1 * 7/2001 Lee

* cited by examiner

Primary Examiner—James R. Brittain
(74) Attorney, Agent, or Firm—Browdy and Neimark

(57) ABSTRACT

A device is designed to retain a cooling piece. The device comprises a main body provided with a press portion having two elastic portion on both side, on end of each said elastic portion extend downward to form a leg portion with a retaining portion; one leg portion stretches inward and upward to form a hook, and the leg portion has an operation hole located on the upside of the hook.

2 Claims, 3 Drawing Sheets

DEVICE FOR RETAINING COOLING PIECE

FIELD OF THE INVENTION

The present invention relates generally to a cooling piece, and more particularly to a device for retaining the cooling piece.

BACKGROUND OF THE INVENTION

As shown in FIG. 1, the prior art device 80 mainly embraces a central portion acting as a pressing portion 82, on both ends of the pressing portion, two tilt extensions constitute two elastic portions 83. The end of the elastic portion 83 drops downward to become a buckle leg 84. Each buckle leg 84 has a perforated hole 85. A central part of one buckle leg 84 stretches outward and upward to form a hook blade 86. As shown in FIG. 2, the device 80 holds the cooling piece 90 with the perforated hole 85 of one buckle leg 84 grasp the end jaw 97 of CPU socket 95. Then holding a cabinet tip of a screwdriver 99 at the mid-way between the perforated hole 85 and the buckle leg 84, forcing the buckle leg 84 to move inward in such way as to push the perforated hole 85 entering into the jaw 97 of the CPU socket 95 so the cooling piece 90 will intimately attached to the CPU 94.

However, in the normal assembly operation, if the screwdriver 99, being too small in size, can be easily clamped between the hook blade 86 and the buckle leg 84, very hard for the operator to pull off. If the screwdriver 99 is too large, when the force is improperly applied, it might easily skid out of the hook blade 86. If the force applied is too powerful, it might produce severe damage to the parts on the main board 100. In case the operator's hand hits the cooling piece 90, it results in a critical injury, cut or incident.

SUMMARY OF THE INVENTION

It is therefore the primary objective of the present invention to provide a device for retaining a cooling piece. The retaining device can be easily mounted and dismounted.

It is another objective of the present invention to provide a device for retaining a cooling piece. The retaining device prevents the screwdriver from being clamped in the process of operation.

It is still another objective of the present invention to provide a device for retaining a cooling piece. The retaining device prevents the screwdriver from skidding off and averts the incident injury and cut to the operator.

In keeping with the principle of the present invention, the foregoing objective of the present invention is attained by a retaining device comprising a main body provided with a press portion having elastic portions on both sides of the press portion, leg portion with a retaining portion extending down from the ends of the elastic portions; one leg portion stretches inward and upward to form a hook, and the leg portion has an operation hole located on the upside of the hook.

The foregoing objectives, features, functions and advantages of the present invention will be more readily understood upon a thoughtful deliberation of the following detailed description of a preferred embodiment of the present invention with reference to the accompanying drawings.

DETAILED DESCRIPTION OF THE INVENTION

Figure 1:
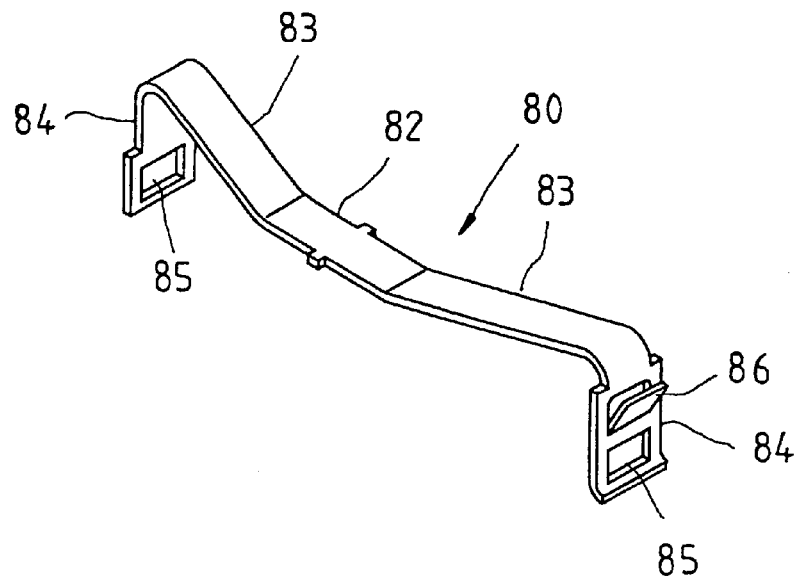
FIG. 1 shows a perspective view of a cooling piece retaining device of the prior art.
Figure 2:
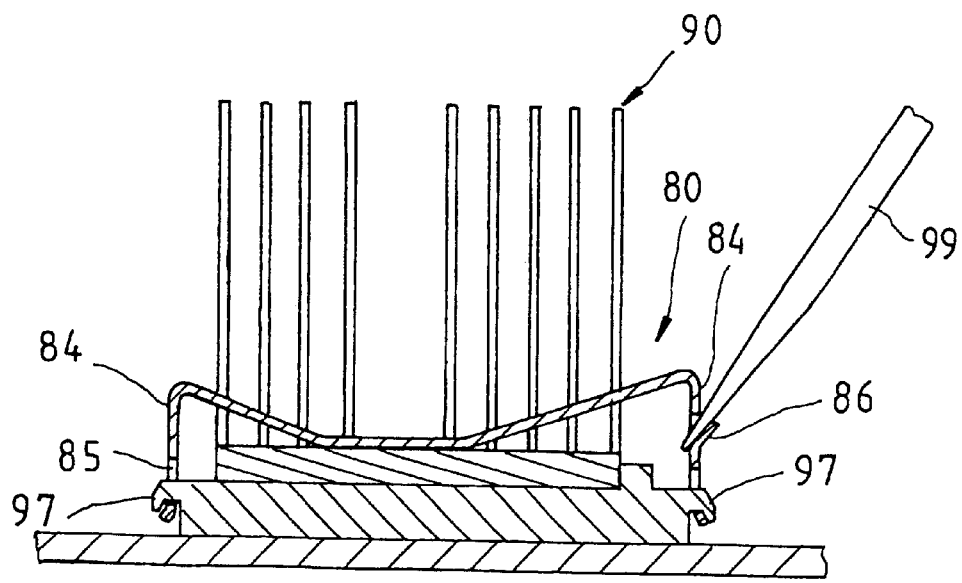
FIG. 2 shows a schematic view of the cooling piece retaining device of the prior art in use.
Figure 3:
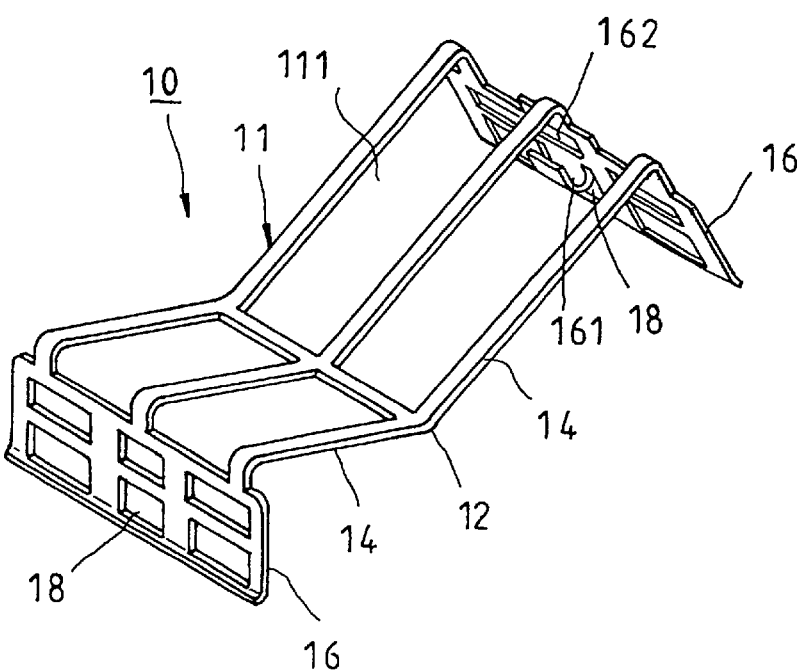
FIG. 3 shows a perspective view of the first preferred embodiment of the present invention.

As shown in FIG. 3, a device 10 of the first preferred embodiment of the present invention is intended to retain a cooling piece on a computer CPU. The device 10 comprises a main body 11 having several through holes 111 for the cooling fins to pass through. The main body 11 is provided at the midsegment thereof with a press portion 12 with both ends extending outward to become a elastic portion 14. One end of each elastic portion stretches downward to form a leg portion 16. Each leg portion 16 has a retaining portion 18 at the bottom. In this embodiment, the retaining portion is a buckle hole; one leg portion 16 stretches inward and upward to form a hook 161, and the leg portion 16 has an operation hole 162 located on the upside of the hook 161.

Figure 4:
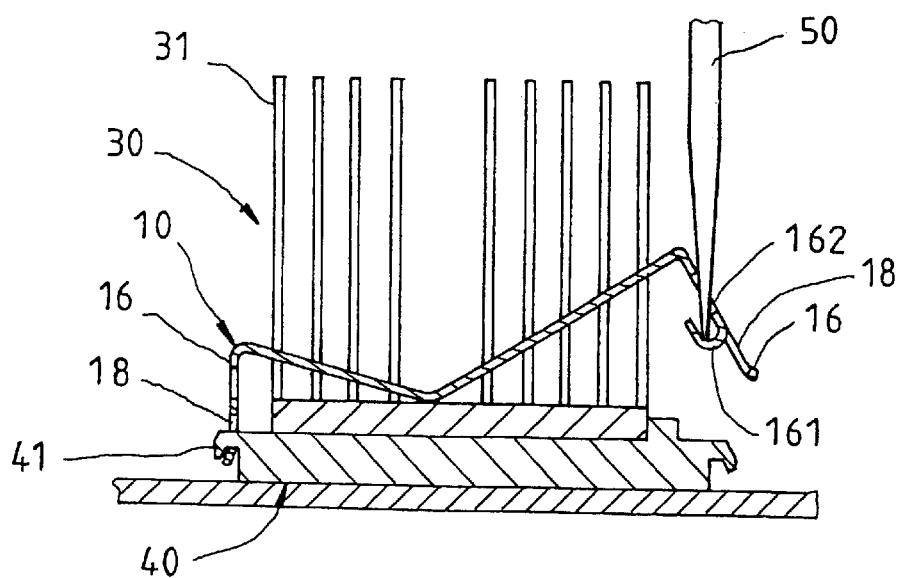
FIG. 4 shows a side schematic view of the first preferred embodiment of the present invention in operation.
Figure 5:
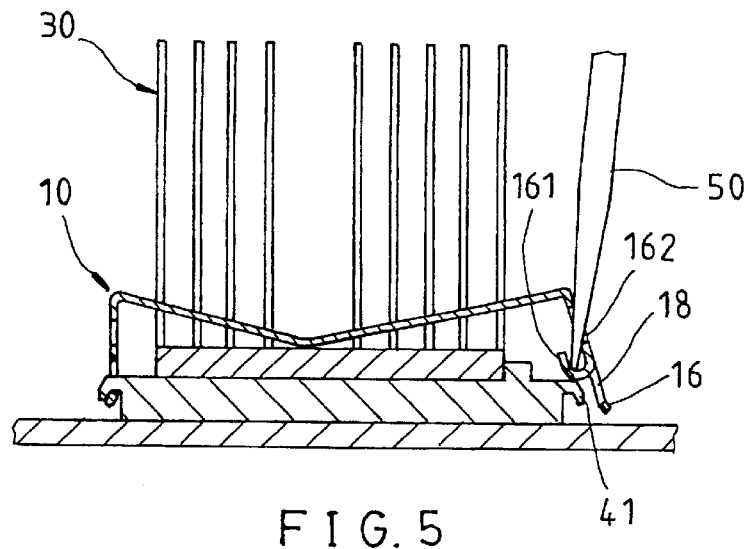
FIG. 5 shows another side schematic view of the first preferred embodiment of the present invention in operation.
Figure 6:
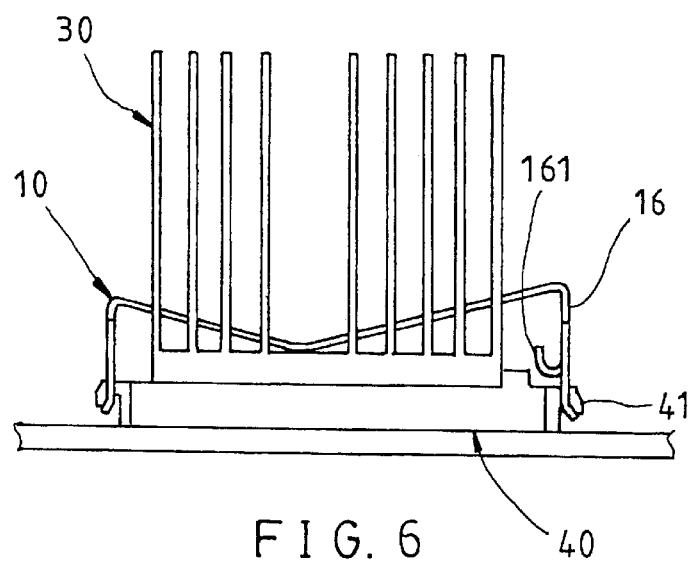
FIG. 6. shows a side schematic view of the first preferred embodiment of the present invention after assembly.

As shown in FIG. 4, in the assembly operation, the device 10 is placed on the cooling piece 30. The cooling fins 31 will pass through holes 111 (the through holes are shown in FIG. 3). First the retaining portion 18 of one leg 16 is engaged to the jaw 41 on the rim of the CPU socket 40. Next, the cabinet tip screwdriver 50 is inserted along the outside of leg portion 16 into the operation hole 162, and the hook 161 firmly pressed. As shown in FIG. 5, when the screwdriver 50 is forced down, the leg portion 16 is lowered to the place where the retaining portion 18 will align to the jaw 41 of the CPU socket 40. The screwdriver 50 can then move the retaining portion 18 under the jaw 41. Finally, the screwdriver 50 is taken out of the operation hole 162. This ends the assembly operation. The completed assembly status is illustrated in FIG. 6. Under this condition, the press portion 12 vigorously presses on the cooling fin assembly 30 in place.

In the disassembly operation, it takes the reversed assembly steps. Firstly insert the screwdriver 50 along outside of the operation hole 161 to propel the hook 161. Forcing the screwdriver 50 down to move the retaining portion 41 outward for disengaging from the jaw 41. When lifting the screwdriver 50 upward, the leg 16 will come off the retaining portion 41 due to the spring force of the elastic portion 14. Finally, the screwdriver 50 is taken out of the retaining device 10. The retaining portion 18 on the other leg portion 16 then can easily be disengaged from the other jaw 41 of the CPU socket 40. This is the end of the disassembly.

Figure 7:
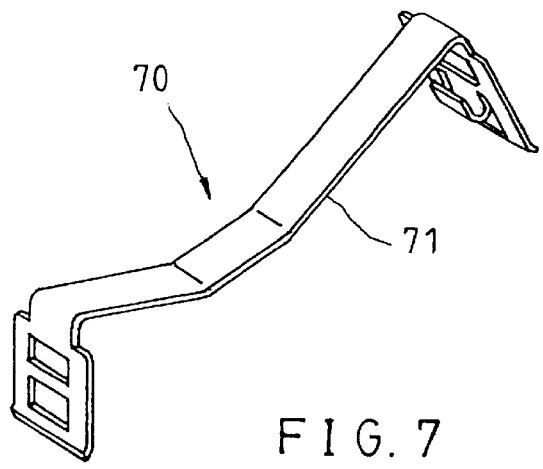
FIG. 7 shows a perspective view of the second preferred embodiment of the present invention.

As shown in FIG. 7, a device 70 of the second preferred embodiment of the present invention is basically similar in construction to the device 10 of the first preferred embodiment of the present invention, with the difference being that the main body 71 is in the form of long strap without through holes. In the assembly operation, the whole band sits on the top of the cooling fin assembly (not shown in the figure). The assembly operation is similar to the previous embodiment.

The present invention has advantages, which are described hereinafter:

It is assured that the screwdriver will never be clamped in the hook. Because the hook in the invention extends inward and upward, leaving a tiny room for the screwdriver a free movement. The operator can feel the freedom of the screwdriver in operation.

It is assured that the screwdriver never skids. In the operation, the screwdriver will enter into the operation hole which in turn confines the movement of the screwdriver to prevent it from skidding out of place. The operator can feel safety and comfort, no worry of damage to the main board and incident injury.

What is claimed is:

1. A device for retaining a cooling piece on a CPU mounted on a connector which has two lugs, said device comprising:

a unitary main body having a press portion for pressing the cooling piece onto the CPU;

at least two elastic portions extending linearly upward from opposite sides of the press portion;

a pair of leg portions respectively engaged to ends of the elastic portions extending down toward the connector;

a retaining hole in each of the leg portions adapted for respective engagement to the lugs;

a hook opening upward from the connector formed on an interior side of one of the leg portions above the corresponding retaining hole; and an operation hole formed in said one of the leg portions above the hook adapted to permit insertion of a lever to engage the hook within the device;

wherein when the device is engaged to the lugs, the cooling piece extends upward between the elastic portions.

2. The device according to claim having three elastic portions extending upward from opposite sides of the press portion;

wherein when the device is engaged to the lugs, the cooling piece extends upward between the three elastic portions.

* * * * *